(12) United States Patent
Mu

(10) Patent No.: US 8,489,040 B2
(45) Date of Patent: Jul. 16, 2013

(54) DOUBLE CLIPPED RF CLOCK GENERATION WITH SPURIOUS TONE CANCELLATION

(75) Inventor: Fenghao Mu, Hjärup (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 621 days.

(21) Appl. No.: 12/708,349

(22) Filed: Feb. 18, 2010

(65) Prior Publication Data

US 2011/0199142 A1    Aug. 18, 2011

(51) Int. Cl.
*H04B 1/04*    (2006.01)
*H04B 1/10*    (2006.01)

(52) U.S. Cl.
USPC ............ 455/114.1; 455/114.2; 455/119; 455/296; 455/310; 455/317

(58) Field of Classification Search
USPC .............. 455/114.1, 114.2, 119, 296, 310, 455/317
See application file for complete search history.

(56) References Cited

U.S. PATENT DOCUMENTS

| | | | |
|---|---|---|---|
| 6,188,253 B1 * | 2/2001 | Gage et al. | 327/105 |
| 6,922,552 B2 | 7/2005 | Noori | |
| 7,184,283 B2 * | 2/2007 | Yang et al. | 363/41 |
| 2006/0115005 A1 * | 6/2006 | Hickling | 375/247 |
| 2007/0036256 A1 * | 2/2007 | Yamaguchi et al. | 375/371 |
| 2009/0060109 A1 * | 3/2009 | Park | 375/371 |
| 2011/0175758 A1 * | 7/2011 | Iqbal et al. | 341/94 |
| 2011/0182389 A1 * | 7/2011 | Breems et al. | 375/346 |

FOREIGN PATENT DOCUMENTS

| | | |
|---|---|---|
| JP | 2-116227 A | 4/1990 |
| JP | 2003-218710 A | 7/2003 |
| WO | WO 99/22456 A2 | 5/1999 |

OTHER PUBLICATIONS

Eric A.M. Klumperink et al., "Polyphase Multipath Radio Circuits for Dynamic Spectrum Access", IEEE 0163-6804, Cognitive Radios for Dynamic Spectrum Access, May 2007, pp. 104-112 (9 total pages).

* cited by examiner

*Primary Examiner* — Wen Huang
(74) *Attorney, Agent, or Firm* — Potomac Patent Group PLLC

(57) ABSTRACT

A clock generator circuit generates a wanted RF clock signal by using an up-converter, a spurious tone cancellation circuit, a controller, and at least two clock driver/dividers. The spurious tone cancellation circuit includes a tone detection circuit and a tone generation circuit. The up-converter mixes modulation signals with local quadrature RF clock signals to create an up-converted signal having a frequency tone equal to a desired frequency of the wanted RF clock signal. The first clock driver/divider amplifies and clips the up-converted signal into a first-clipped clock signal. The tone detection circuit detects the amplitude and phase of unwanted tones of the first-clipped clock signal in the baseband domain and provides information to the controller, which controls the tone generation circuit to cancel the unwanted tones and create a compensated version of first-clipped clock signal. The second clock driver/divider further amplifies and clips the compensated version of first-clipped clock signal to generate the wanted RF clock signal.

16 Claims, 13 Drawing Sheets

DOUBLE CLIPPED RF CLOCK GENERATION WITH SPURIOUS TONE CANCELLATION

TECHNICAL FIELD

Embodiments described herein relate generally to radio frequency (RF) communication devices, and, more particularly, to the generation of RF clock signals by a RF communication device.

BACKGROUND

In RF communication systems, clock signals may be used for a number of different purposes. RF communication systems require good clock signals to work properly.

In an RF mobile terminal, RF clock signals may be created on-chip by phase-locked-loops (PLLs) locking at an external crystal resonator as a reference clock input with different dividing factors. For transmitter and receiver circuits running at different frequencies, normally at least two PLLs are needed in an RF integrated circuit (IC). For some mobile terminals, such as mobile terminals that support multiple RF communication standards (e.g., wireless local area networks, Bluetooth, GPS, LTE etc.), additional RF clock signals, and hence additional PLLs, may be needed. Further, in some suggested radio standards, in order to increase communication data rate, carrier aggregation is suggested, in which additional RF clock signals may be required.

Creating many RF clocks using PLLs, however, is not an easy task. When several PLLs are integrated into a single chip, it can become problematic as the PLLs may interfere with each other, degrading the performance of the PLLs. Interference between PLLs may depend on the physical distance between the PLLs and the frequency difference between the PLLs.

Techniques are known for creating additional RF (or even other frequency spectrum, such as microwave) clock signals without adding a new PLL. One such technique uses an up-converter to convert input modulation clock signals and local RF clock signals into the desired RF clock signal, where the frequency of the desired RF clock signal, $f_c$, is equal to either $f_0+f_m$, or $f_0-f_m$. For simplicity, here we only discuss the situation in which $f_c=f_0+f_m$, assuming that $f_m$ can be either positive or negative. Here, $f_o$ is the frequency of the local RF clock signal and $f_m$ is the fundamental frequency of the input modulation clock signal. In practice, however, the signal output from the up-converter is not an ideal signal, and instead of creating a single tone clock signal spectrum, it may also generate undesired tones in its spectrum, expressed as:

$$S(f) = \sum_{i=0}^{ni} \sum_{j=-nj}^{nj} \beta_{ij}\delta(f - i \cdot f_0 - j \cdot f_m). \quad (1)$$

In this equation, i, j, $n_i$ and $n_j$ are integers. The energy of the created clock signal is limited, so $\beta_{ij}$ can become extremely small for large i and j. Setting $n_i$ and $n_j$ to five would, in most cases, be sufficient for convergence. When i=1 and j=1 is the tone for the created clock signal, the desired tone, $f_c=f_0+f_m$, is generated. The other created tones are spurious tones. The most harmful of these tones may be the tones that are close to the created clock tone. For example, when i=1 and j=1 is the desired clock tone, the tones created at i=1 and j={-5,-4,-3,-2,-1,0,2,3,4,5} are harmful. Here, these tones are referred to as modulation tones, as they are created by the non-linearity in handling the modulation signals. Other tones, created for i≠1, are referred to as harmonic tones, and they are normally located at the centers or neighborhood of the harmonics of RF clock $f_0$.

When generating additional RF clock signals using an up-converter, it is desirable to eliminate the undesirable modulation and harmonic tones as much as possible.

SUMMARY

It is an object of the invention to overcome at least some of the above disadvantages, and to provide for clock generation circuits that can generate a number of high quality RF clock signals.

An embodiment described herein may provide for a clock generator circuit to generate a target clock signal, the wanted RF clock signal. The clock generator circuit may include an up-converter to up-convert modulation signals and quadrature local radio frequency clock signals to obtain an up-converted signal having a frequency tone equal to a desired frequency of the wanted RF clock signal. A band pass filter may filter the up-converted signal and output a filtered version of the up-converted signal to a first clock driver/divider, and the first clock driver/divider amplifies and clips the filtered version of the up-converted signal to obtain a first-clipped clock signal. A spurious tone cancellation circuit may include a tone detection circuit to detect a residual error signal of one or more unwanted tones in a compensated version of the first-clipped clock signal. A tone generation circuit generates cancellation tones based on the detected one or more unwanted tones, and a coupler couples the cancellation tones to the first-clipped clock signal to obtain the compensated version of the first-clipped clock signal. Finally, a second clock driver/divider further amplifies and clips the compensated version of the first-clipped clock signal to obtain the wanted RF clock signal.

Another possible embodiment described herein may provide a method of producing a wanted RF clock signal. The method may include mixing modulation signals and quadrature local radio frequency clock signals to obtain an up-converted signal having a frequency tone equal to a desired frequency of the wanted RF clock signal. The method may further include band-pass filtering the up-converted signal to output a filtered version of the up-converted signal. The method may further include clipping the up-converted signal to generate a first-clipped clock signal; sequentially detecting residual error signals of a plurality of unwanted frequency tones in a compensated version of the first-clipped clock signal; and writing data patterns, based on the detected plurality of unwanted frequency tones, to one or more memories. The data patterns, when read out from the one or more memories, produce cancellation tones that have amplitude and phase values to cancel or offset the plurality of unwanted frequency tones. The method may include tuning the amplitude and phase corresponding to the data patterns based on the detected residual error signals. The method may further include coupling the cancellation tones to the first-clipped clock signal to obtain the compensated version of the first-clipped clock signal and clipping the compensated version of the first-clipped clock signal to generate the wanted RF clock signal.

Another embodiment described herein may include a mobile terminal that includes an antenna; a processing system to control the operation of the mobile terminal; and a transceiver component, connected to the processing system and the antenna, to wirelessly send and receive data, the transceiver component including a clock generator circuit for generating a wanted RF clock signal or a plurality of wanted RF clock signals. The clock generation circuit may include an up-converter to up-convert modulation signals and quadrature local radio frequency clock signals to obtain an up-converted signal having a frequency tone equal to a desired frequency of the wanted RF clock signal; a first clock driver/divider to amplify and clip the up-converted signal into a first clipped clock signal; a tone detection circuit to detect a residual error signal of one or more unwanted tones in a compensated version of the first-clipped clock signal; a controller to determine cancellation tones corresponding to the detected one or more unwanted tones; a tone generation circuit to generate the cancellation tones determined by the controller; a coupler to couple the cancellation tones to the first-clipped clock signal to obtain the compensated version of the first-clipped clock signal; and a second clock driver/divider to further clip the compensated version of the first-clipped clock signal to generate the wanted RF clock signal.

In some implementations, the tone generation circuit may include pattern registers, each of the pattern registers storing a pattern corresponding to one of the cancellation tones; and an output coupler to combine the cancellation tones.

In some implementations, the tone detection circuit may include a first mixer to receive the compensated version of the first-clipped clock signal as an input signal and down-convert the input signal based on the quadrature local radio frequency clock signal. A second mixer may convert the down converted signal to a signal that includes a baseband representation of the one or more unwanted tones.

In some implementations, the spurious tone cancellation circuit may additionally include a controller to set one of the one or more unwanted tones that is to be detected by the tone detection circuit. The controller also calculates the data patterns based on detected amplitude and phase values corresponding to the residual error signal of the unwanted tones, writes or modifies the digital patterns to implement a procedure of minimizing the residual error signals.

In some implementations, the clock generator may be implemented within a wireless communication terminal for generating RF clock signals for both transmitter and receiver using one single PLL.

In some implementations, the wanted RF clock signal may be used in a wireless device using standards such as GSM, WCDMA, Bluetooth, WLAN, or LTE.

Systems and/or methods described herein may provide for the generation of a clock signal, such as an RF clock signal, using input RF local oscillator signals and lower frequency modulation signals. Multiple different clock signals may be generated based on the quadrature RF local oscillator clock signals in which tone cancellation is applied to the generated clock signals to clean unwanted tones in the clock signals.

DETAILED DESCRIPTION

The following detailed description refers to the accompanying drawings. The same reference numbers in different drawings may identify the same or similar elements. Also, the following detailed description does not limit the invention.

Figure 1:
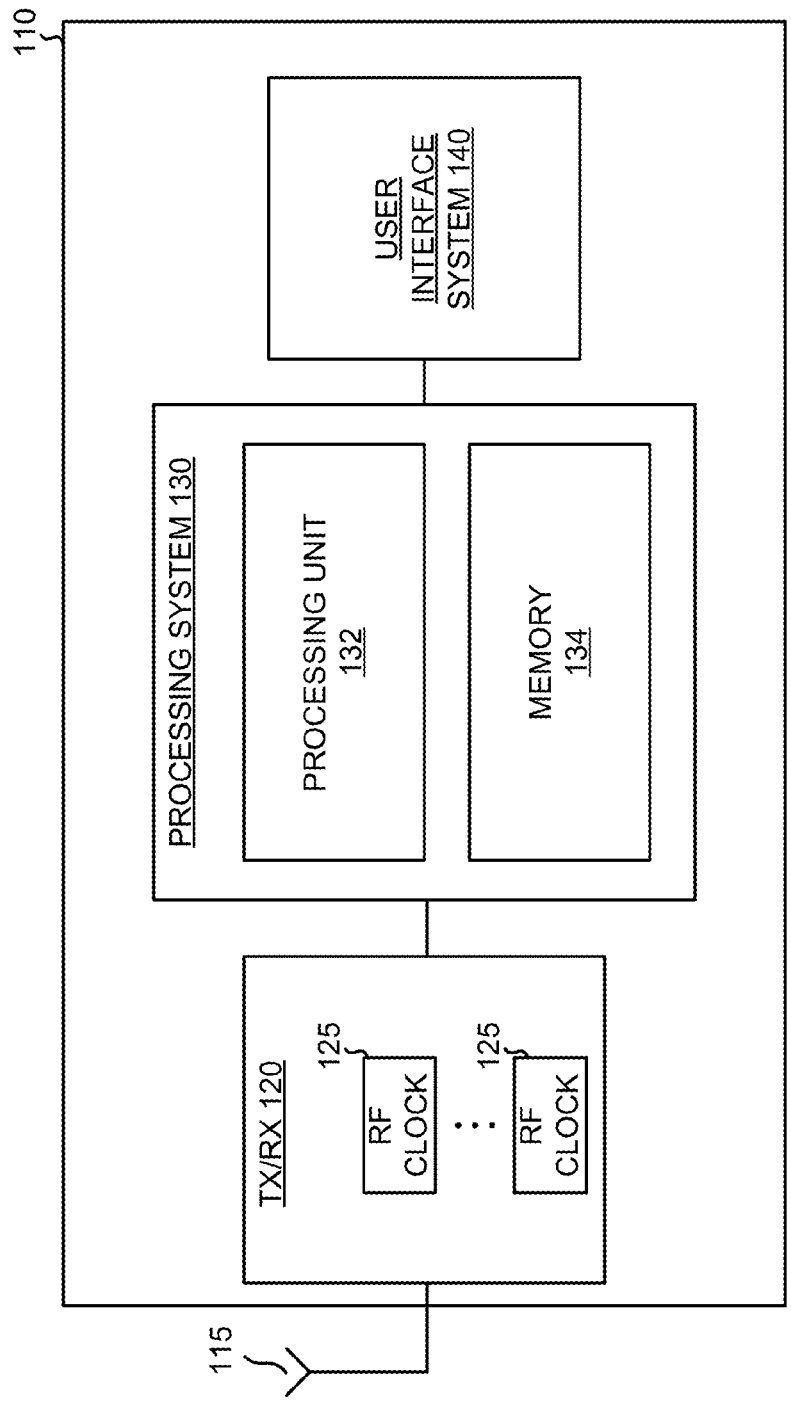
FIG. 1 is a diagram of exemplary components of a device in a network.

FIG. 1 illustrates a diagram of exemplary components of a device in a wireless network, such as a mobile terminal or other wireless device, generally referred to herein as user equipment (UE) 110. As shown in FIG. 1, UE 110 may include an antenna 115, transceivers (TX/RX) 120, a processing system 130, and a user interface system 140.

Antennas 110 may include one or more omni-directional antennas. Transceivers 120 may be associated with antennas 110 and may include transceiver circuitry for wirelessly transmitting and/or receiving data with a base station in the wireless network. Transceivers 120 may particularly include one or more RF clock generator circuits 125 that each generates a periodic RF clock signal. Each of RF clock generator circuits 125 may generate its RF clock signal based on a single set of quadrature local RF clock signals, such as generated using a PLL, and low frequency modulation signals. RF clock generator circuits 125 may share the input set of quadrature local RF clock signals and may be implemented without a separate PLL, thus allowing a number of RF clock signals to be generated without each signal requiring a PLL. Implementations of RF clock generator circuits 125 will be described in more detail below.

Processing system 130 may control the operation of UE 110. Processing system 130 may process information received via transceiver 120 and/or user interface system 140. As illustrated in FIG. 1, processing system 130 may include a processing unit 132 and a memory 134. However, systems and/or methods described herein are not limited to any specific combination of hardware circuitry and software.

Although FIG. 1 shows exemplary components of UE 110, in other embodiments, UE 110 may contain fewer, different, differently arranged, or additional components than depicted in FIG. 1. Alternatively or additionally, one or more components of UE 110 may perform one or more tasks described as being performed by one or more other components of UE 110.

RF Clock Circuit

Figure 2:
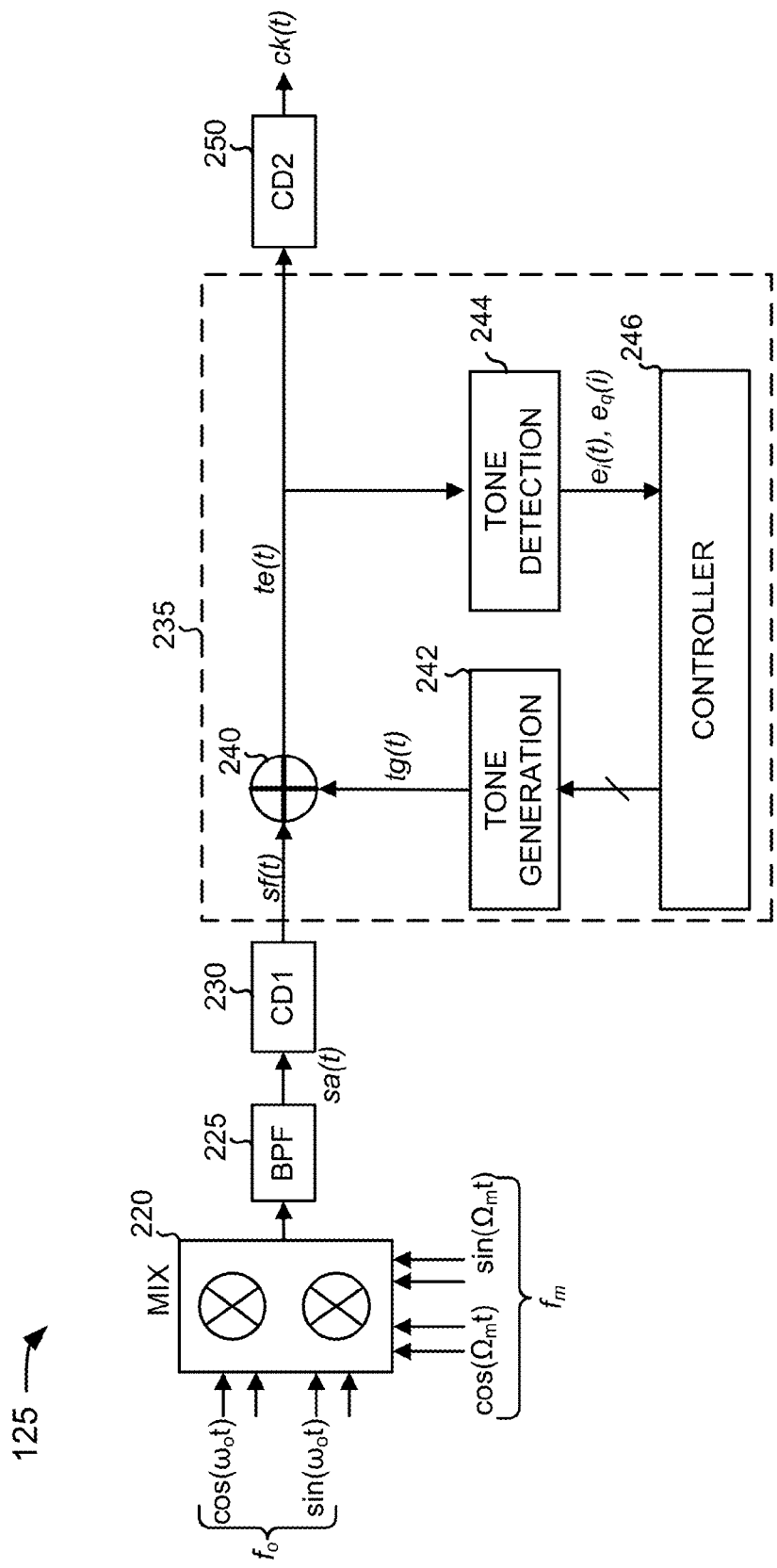
FIG. 2 is a diagram illustrating an exemplary implementation of an RF clock circuit.

FIG. 2 is a diagram illustrating an exemplary implementation of one of RF clock generator circuits 125. In general, RF clock generator circuit 125 may use an up-converter to mix low frequency modulation signals with quadrature local oscillator (LO) RF clock signals to obtain a wanted RF clock signal. Tone cancellation is performed to reduce spurious tones in the output signal to obtain a high quality RF clock signal, ck(t).

As particularly shown, RF clock generator circuit 125 may include, in a serially connected arrangement, an up-converter (mixer, MIX) 220, a band pass filter (BPF) 225, a first clock driver or clock divider (clock driver/divider) (CD1) 230, spurious tone cancellation circuit 235, and a second clock driver or clock divider (clock driver/divider) (CD2) 250. Spurious tone cancellation circuit 235 may include a linear coupler 240, a tone generation circuit 242, a tone detection circuit 244, and a controller 246. In general, up-converter 220 may operate to produce a signal having a desired clock frequency. Spurious tone cancellation circuit 235 may operate to remove unwanted modulation and harmonic tones from the signal and to thereby improve the quality of the output clock signal, ck(t).

RF clock generator circuit 125 may generate the output clock signal, ck(t), having a desired frequency $f_c$, based on the low frequency input modulation signals having a fundamental frequency, $f_m$ and the quadrature local RF clock signals having frequency $f_o$. The quadrature local RF frequency clock signals may be generated using a PLL. The quadrature local RF frequency clock signals with frequency $f_o$ and modulation signals with frequency $f_n$ may be input to up-converter 220 as quadrature signals, labeled as $\cos(\omega_o t)$ and $\sin(\omega_o t)$ (corresponding to $f_o$) and $\cos(\Omega_m t)$ and $\sin(\Omega_m t)$ (corresponding to $f_m$). The quadrature local RF clock signals $f_o$ and modulation signals with frequency $f_m$ may be input to a number of similarly constructed clock generator circuits 125 and used as the basis for generating a corresponding number of different RF clock signals.

Up-converter 220 may mix its input signals to generate an output signal having a desired tone at $(f_o+f_m)$ or $(f_o-f_m)$ (where $f_o$ refers to the frequency of the local oscillator RF clock signal). In practice, because the load impedance of up-converter 220 is not zero and the output impedance of the active components are not infinite, up-converter 220 may have a nonlinear transfer function that introduces unwanted harmonic tones and modulation tones. More particularly, an ideal up-converter may convert the input modulation signals and the quadrature local RF clock signals into the wanted clock signal based on the following equation:

$$\sin(\omega_0 t)\cdot\cos(\omega_m t)\pm\cos(\omega_0 t)\cdot\sin(\omega_s t)=\sin(\omega_0 t\pm\omega_m t)=\sin(\omega_c t). \quad (1)$$

The output signal in equation (1) contains only a single tone, the wanted clock signal. Here, $\omega_0=2\pi f_0$, $\omega_s=2\pi f_s$, and $\omega_c=2\pi f_c$, respectively. For the unwanted modulation tones close to the wanted clock signal, the actual, non-ideal output of up-converter 220, down-converted to baseband, however, can be approximated by a polynomial function of the input modulation signals instead of the original input modulation signals x(t) as:

$$y(t)=a_0+a_1x(t)+a_2x(t)^2+a_3x(t)^3+a_4x(t)^4+a_5x(t)^5+\ldots \quad (2)$$

From equation (2), it can be seen that unwanted modulation tones are produced by the coefficient terms $a_n$, where n is greater than one.

Figure 3:
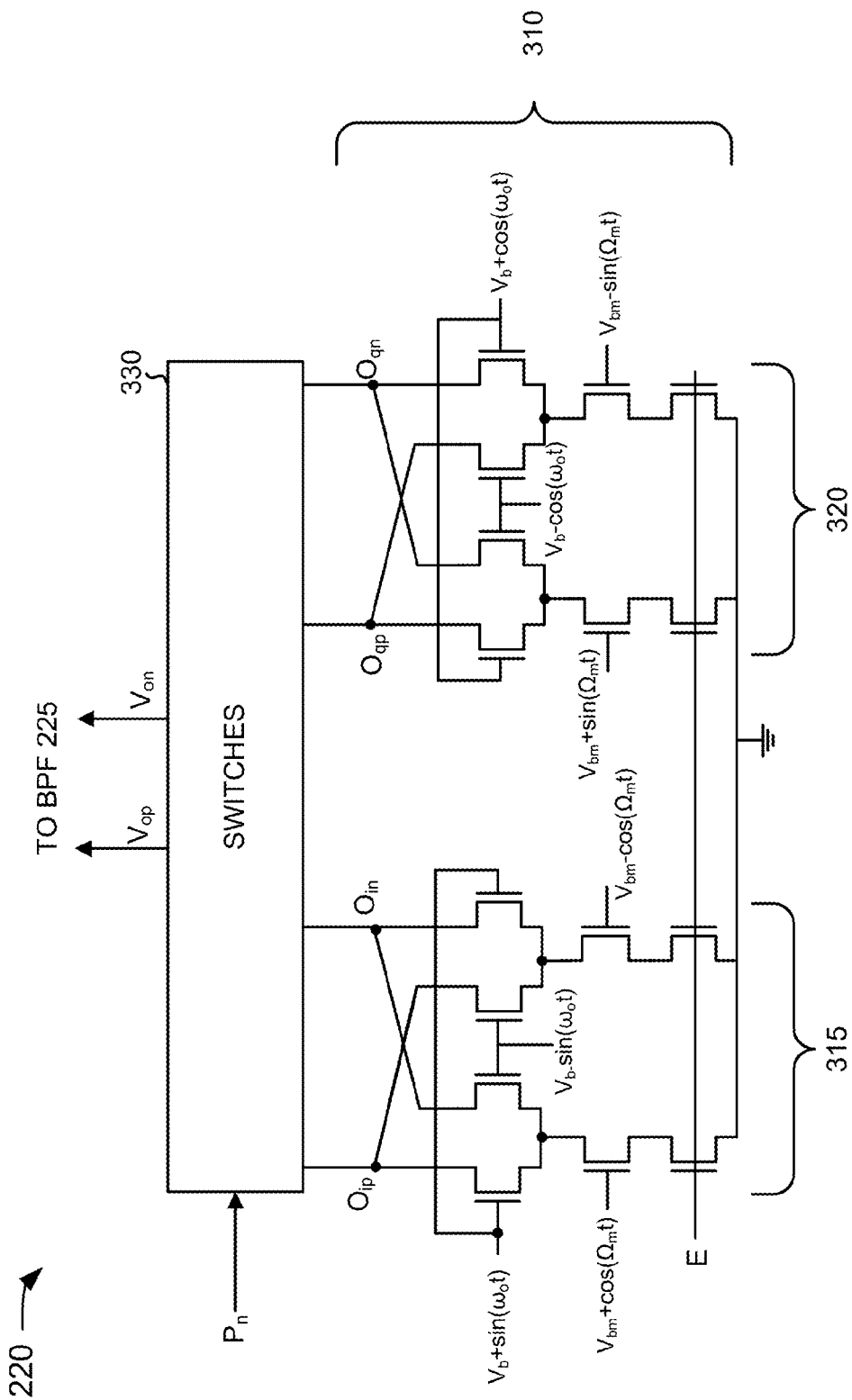
FIG. 3 is a diagram illustrating an exemplary implementation of an up-converter.

FIG. 3 is a diagram illustrating an exemplary implementation of up-converter 220. Up-converter 220 may be built with the known Gilbert mixer topology. Up-converter 220 may include a double balanced mixer topology, which may give good cancellation of even order distortion and LO leakage.

As particularly shown in FIG. 3, up-converter 220 may include a double balanced mixer 310 and switches 330, which may be used to select the desired output frequency creating either $f_0+f_m$ or $f_0-f_m$.

Double balanced mixer 310 may perform the up-conversion of the input signals. Double balanced mixer 310 may include a first section 315 and a second section 320. Each section 315 and 320 may include eight transistors, connected as shown. The output of first section 315 is labeled as nodes $O_{ip}$ and $O_{in}$. The output of second section 320 is labeled as nodes $O_{qp}$ and $O_{qn}$.

Switches 330 may select, based on the value of input pin $P_n$, which of nodes $O_{ip}$, $O_{in}$, $O_{qp}$, and $O_{qn}$, to select for output nodes $v_{op}$ and $v_{on}$. Controller 246 may control the value of $P_n$. For example, when $P_n$ is logic high, switches 330 may connect node $v_{op}$ to nodes $O_{ip}$ and $O_{qn}$ and node $v_{on}$ to nodes $O_{in}$ and $O_{qp}$. In this case, the output of up-converter 220 may generate a wanted signal having a frequency tone at $f_o+f_m$. When $P_n$ is logic low, switches 330 may connect node $v_{op}$ to nodes $O_{ip}$ and $O_{qp}$, and node $v_{on}$ to nodes $O_{in}$ and $O_{qn}$. In this case, the output of up-converter 220 may generate a wanted signal having a frequency tone at $f_o-f_m$. Control signal E may act as an enable signal, that, depending on its value, either enables or disables up-converter 220.

Although FIG. 3 shows exemplary components of up-converter 220, in other embodiments, up-converter 220 may contain fewer, different, differently arranged, or additional components than depicted in FIG. 3.

Referring back to FIG. 2, the output of up-converter 220 may be band pass filtered by BPF 225. In one implementation, BPF 225 may include a capacitor and inductor, connected as a band pass filter that is tuned to have a maximum gain at $f_c$. BPF 225 may thus be tuned to pass the desired RF clock signal tone and suppress other tones. The implementation of band pass filters is generally known in the art and will not be described in additional detail herein.

The output of BPF 225, signal sa(t), referred to herein as a filtered version of the up-converted clock signal, may be input to CD1 230. CD1 230 may operate to amplify the input sinusoid clock signal and clip the output amplitude when the output exceeds a preset maximum level. As a result, the input of CD1 230 may be amplified, clipped, and converted by CD1 230 from a sinusoid signal to a first-clipped clock signal, sf(t), at the output of CD1 230. The functionality of CD1 230 can be viewed as a limiter as the output signal, sf(t), will be limited to the range of the logic levels of CD1 230. The output of CD1 230 may be input to spurious tone cancellation circuit 235.

Figure 4:
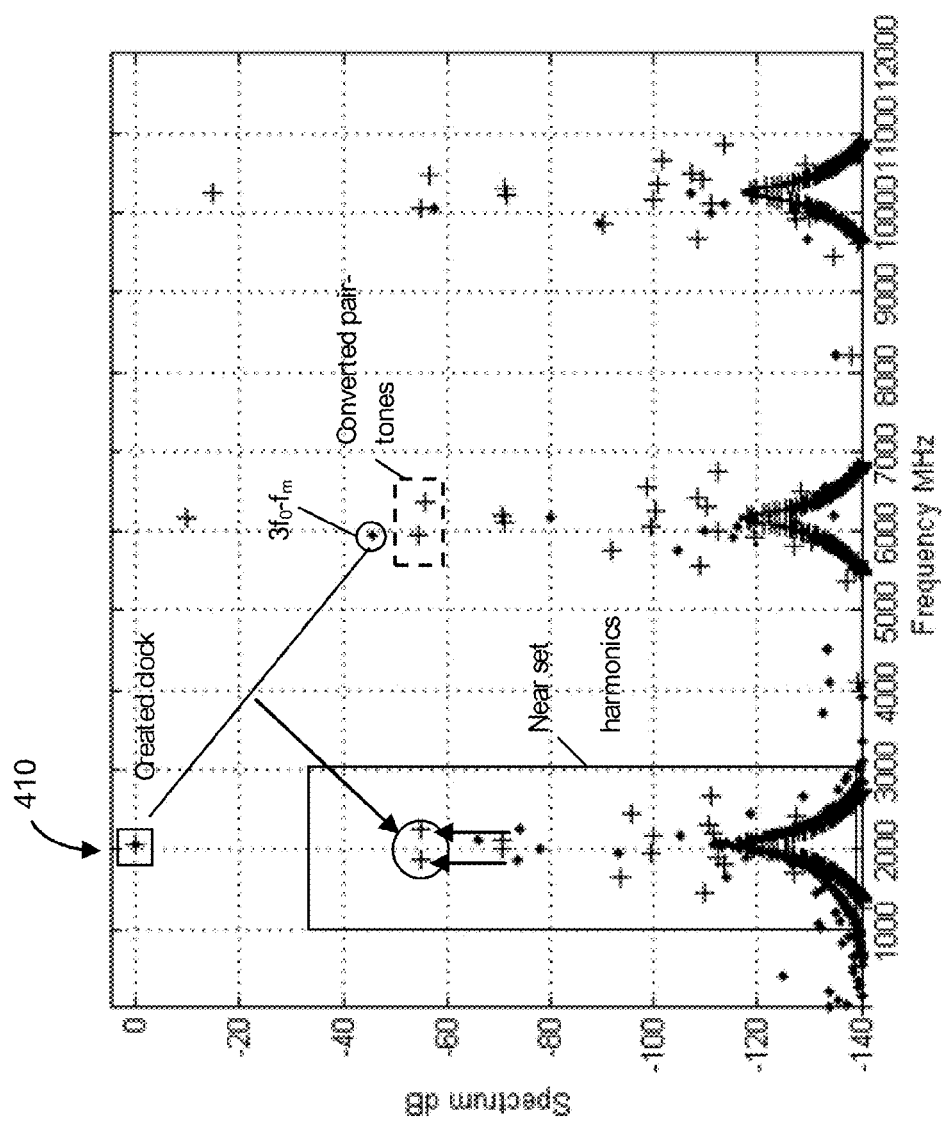
FIG. 4 is a diagram illustrating exemplary frequency spectrums of signals illustrated in FIG. 2.

FIG. 4 is a diagram illustrating exemplary frequency spectrums of signals sa(t), output from BPF 225, and the first-clipped clock signal sf(t), output from CD1 230. More particularly, in FIG. 4, a normalized spectrum is shown based on a simulation at transistor level. Diamonds in FIG. 4 represent the frequency spectrum of sa(t) and plus signs ("+") represent the frequency spectrum of the first-clipped clock signal sf(t). At the frequency $f_0=2$ GHz, $f_c=2.05$ GHz and $f_m=50$ MHz, it can be seen that the frequency spectrum of sf(t) ($f_c\pm200M$) is worse (by approximately 20 dB) than the frequency spectrum of sa(t) ($f_c\pm200M$) around the desired clock tone $f_c$, labeled as tone 410.

The degradation of the spectrum is caused by the limiter function of CD1 230, which amplifies the unwanted harmonic tones at its transition edges, and as a result, unwanted harmonic tones are translated into deterministic periodic jitter. It can also be appreciated that CD1 230 is, in fact, a strong non-linear circuit, and may mix the desired clock tone with unwanted harmonic tones, creating degradation in the spectrum close to the wanted RF clock signal tone. There is no problem for a pure sinusoid clock signal, with frequency $f_c$, being amplified and clipped by a digital gate, as long as the output is periodic. Then it will only contain frequency components at frequencies $m\cdot f_c$, here m is an integer. However, when a pure sinusoid clock signal is mixed with other unwanted tones and amplified or clipped by a digital gate, the distorted harmonic tones and the harmonics of the original clock signal will be mixed together, generating harmful modulation tones around the wanted RF clock signal tone. The most dominate distorted harmonic tone normally is the strongest $3^{rd}$ order harmonic tone, for example at frequency $3f_0-f_m$, for the case in $f_c=f_0+f_m$ frequency conversion. The signal degradation may be significantly caused by this tone.

There are two contribution sources to the modulated tones. One source is generated by the up-converter, for instance, at frequency combination $\{i=1, j=-3\}$ given by eq(1), i.e., $f(1,-3)=f_0-3f_m=f_c-200$ MHz=1.85 GHz, and another source is generated by CD1 230 which mixes the strongest distorted $3^{rd}$ order harmonic tone and the harmonic tone of the wanted RF clock signal. For example, the strongest distorted $3^{rd}$ order harmonic tone is at $3(f_c-f_m)-f_m=5.95$ GHz, and the $2^{nd}$ order harmonic tone of the wanted RF clock signal is $2*f_c=4.1$ GHz, leading to 5.95 GHz−4.1 GHz=1.85 GHz which is also located as the same place as the modulation tone generated by the up-converter. If the distorted $3^{rd}$ order harmonic tone at $3f_c-f_m$ from the spectrum of sa(t) is removed, degradation due to the second source may become relatively small and may be ignored.

Figure 5A:
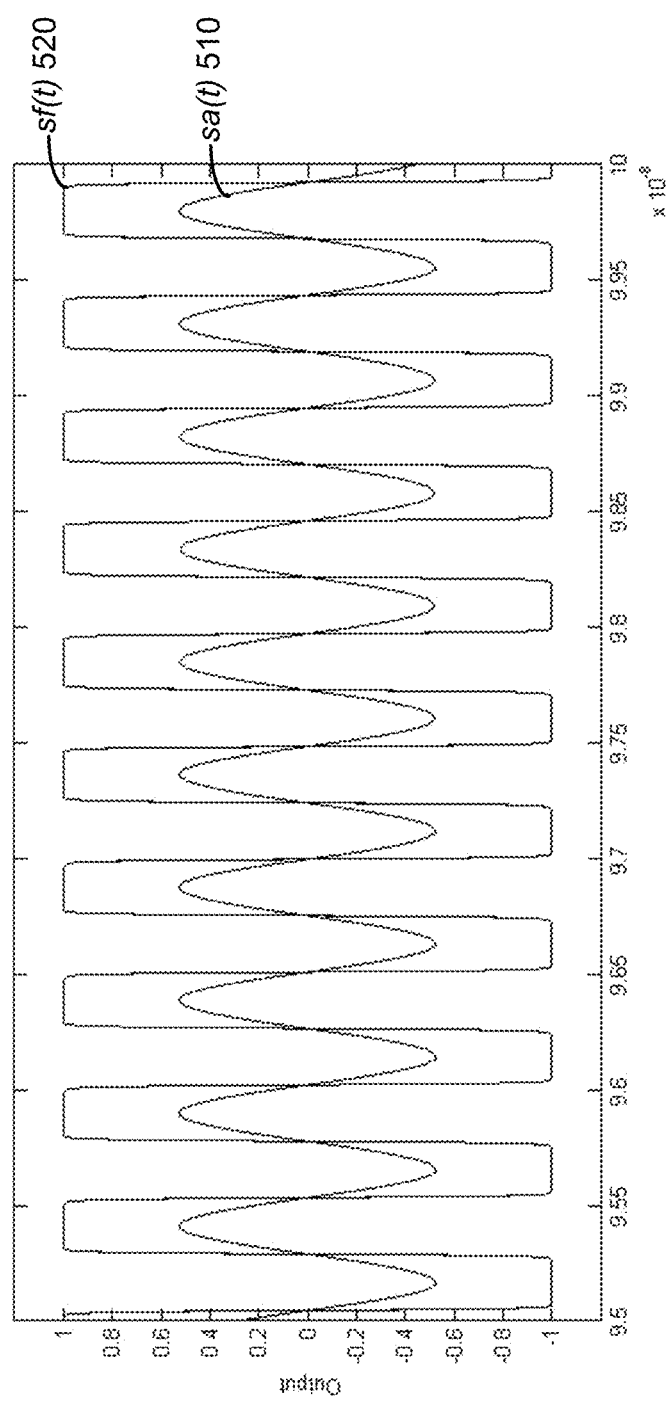
FIG. 5A is a diagram illustrating exemplary time domain waveforms corresponding to a signal shown in FIG. 2.
Figure 5B:
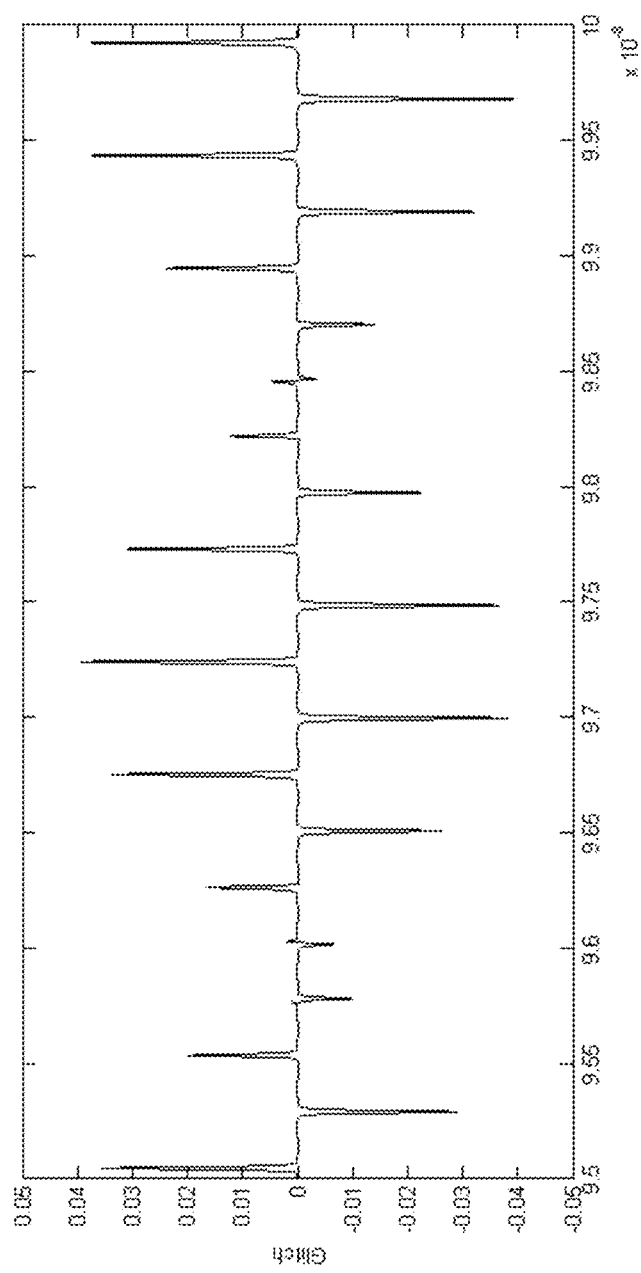
FIG. 5B is a diagram illustrating glitches in the waveforms shown in FIG. 5A.

FIG. 5A is a diagram illustrating exemplary time domain waveforms corresponding to the signals sa(t) and the first-clipped clock signal sf(t) in RF clock generator circuit 125. As shown in FIG. 5A, signal sa(t) 510 is a sinusoid clock signal and signal sf(t) 520 is a first-clipped clock signal. FIG. 5B is a diagram illustrating the difference between the first-clipped clock signal sf(t) 520 and an ideal clock pulse signal. As shown in FIG. 5B, the first-clipped clock signal sf(t) 520 may include a number of glitches, represented as peaks in FIG. 5B, that can be clearly seen. The glitches, which correspond to edges of the clock pulse, may represent deterministic jitter that is repeated in a fixed period. Consistent with aspects described herein, the glitches may be attenuated by cleaning the modulation tones around the desired clock signal by adding "corrective tones" with the same amplitude but opposite in phase to the tones that correspond to the glitches. Spurious tone cancellation circuit 235 may operate to clean the modulation tones by adding the corrective tones.

In general, in spurious tone cancellation circuit 235, tone detection circuit 244 may operate to sequentially detect (i.e., one-by-one) unwanted tones. Tone generation circuit 242 may generate, in parallel, each of the corrective tones corresponding to the unwanted tones detected by tone detection circuit 244. Controller 246 may control the operation of tone generation circuit 242 and tone detection circuit 244.

Figure 6A:
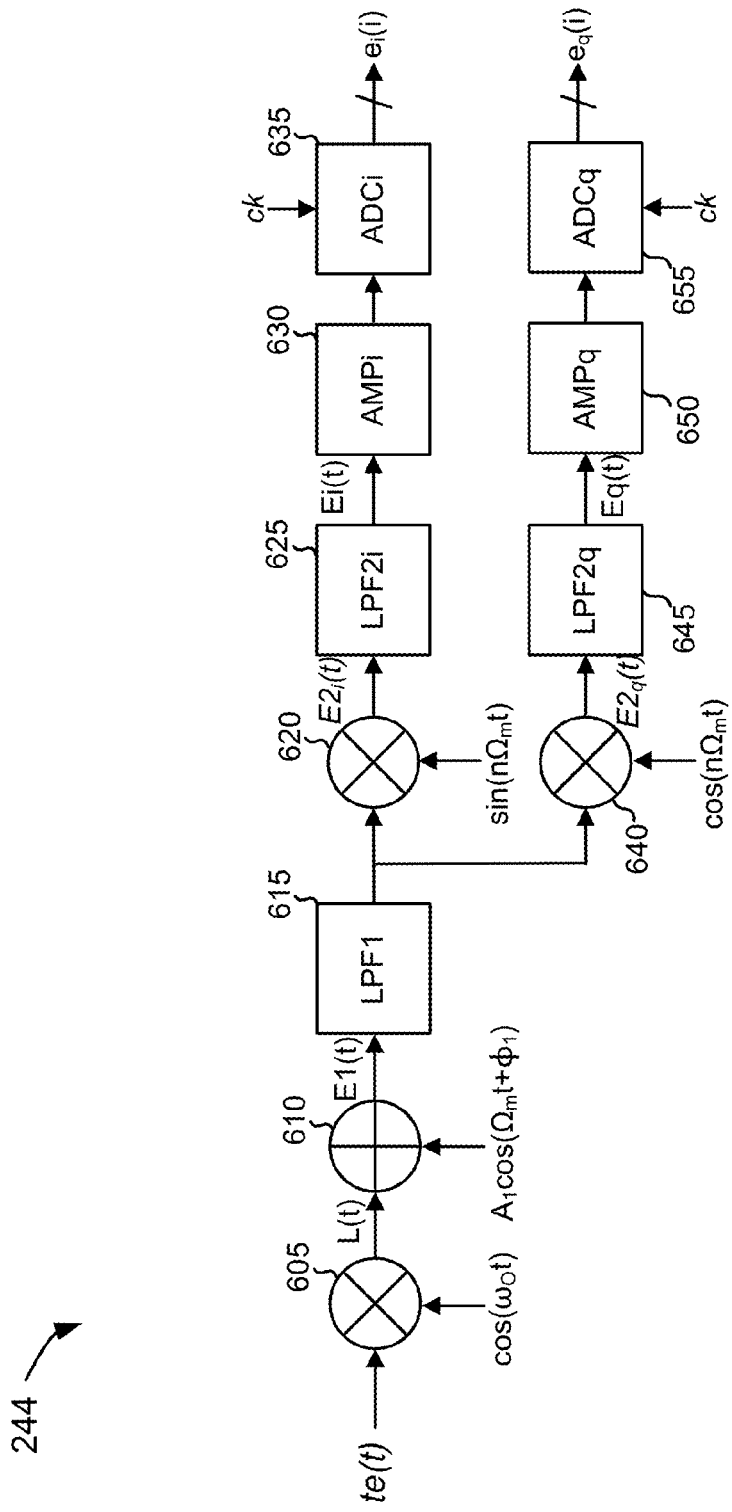
FIG. 6A is a diagram illustrating an exemplary implementation of a tone detection circuit.

FIG. 6A is a diagram illustrating an exemplary implementation of tone detection circuit 244. Tone detection circuit 244 may include a serially connected first mixer 605, coupler 610, and first low pass filter (LPF1) 615. The output of LPF1 615 may be input through an upper signal path and a lower signal path. The output of the upper signal path and the lower signal path may be interleaved quadrature residual error signals $e_i(i)$ and $e_q(i)$, respectively. The upper signal path may include a number of serially connected components, including mixer 620, low pass filter (LPF2$i$) 625, amplifier (AMPi) 630, and analog-to-digital converter (ADCi) 635. The lower signal path may also include a number of serially connected components, including mixer 640, low pass filter (LPF2$q$) 645, amplifier (AMPq) 650, and analog-to-digital converter (ADCq) 655.

First mixer 605 may receive the input signal, a compensated version of the first-clipped clock signal, te(t), and the local RF clock signal, either $\sin(\omega_o t)$ or $\cos(\omega_o t)$ by a clock switch (not shown). First mixer 605 may down convert the input signal based on the local signal to obtain the signal L(t). Coupler 610 may then couple a fundamental modulation frequency signal ($A_1 \cos(\Omega_m t+\phi)$) to L(t), to generate signal E1($t$), and first low pass filter 615 may remove high frequency harmonics from E1($t$). The amplitude and phase of the added modulation frequency signal are represented by $A_1$ and $\phi$, which may be varied by controller 246.

In the upper signal path, the signal output from first low pass filter 615 may be further down converted by mixer 620 to obtain the error signal, signal E2$_i$(t). The down conversion may be based on the modulation signal, $\sin(n\Omega_m t)$. Here n is a variable integer. The frequency of the modulation signal may be varied by controller 246 to be integer multiples of $f_m$ (i.e., $nf_m$), where n may be sequentially set to, for example, the integers in the set $\{0, 1, 2, 3, 5\}$, etc. This integer set may correspond to the modulation tones $\{0, 1, 2, -3, 5\}$, for index j, from equation (1). Similarly, in the lower signal path, the signal output from first low pass filter 615 may be down converted by mixer 640, to obtain the error signal, signal E2$_q$(t). The down conversion may be based on the modulation signal, $\cos(n\Omega_m t)$. As with the modulation signal for the upper signal path, the frequency of the modulation signal may be varied by controller 246 to be integer multiples of $f_m$ (i.e., $nf_m$), where n may be sequentially set to, for example, the integers in the set $\{0, 1, 2, 3, 5\}$.

In both the upper and lower signal paths, the error signals may be low pass filtered, amplified, and converted into a digital form. In the upper signal path, for instance, the signal E2$_i$(t) may be low pass filtered by LPF2$i$ 625. In the lower signal path the signal E2$_q$(t) may be low pass filtered by LPF2$q$ 645. LPF2$i$ 625 and LPF2$q$ 645 may operate to remove ripples in the signals. The results of the low pass filters, signals $E_i(t)$ and $E_q(t)$, are relatively clean and slowly changing baseband signals. Signals $E_i(t)$ and $E_q(t)$ are amplified by AMPi 630 and AMPq 650, respectively. The amplified error signals then are converted into a digital format by ADCi 650 and ADCq 655, to obtain the output error signals $e_i(i)$ and $e_q(i)$, respectively. Output error signals $e_i(i)$ and $e_q(i)$ are processed by controller 246, as will be described in more detail below.

Although two separate error channels, $e_i(i)$ and $e_q(i)$, were described for tone detection circuit 244, in an alternative implementation, the two separate channels may be replaced with a single channel in which the two error signals are obtained through interleaving.

The modulation frequency multiples (e.g., 2$f_m$, 3$f_m$, 5$f_m$) used by tone detection circuit 244 may be created using, for example, a frequency divider that receives a higher frequency clock signal, such as 30$f_m$. An alternative option to generate the modulation frequency multiples may use a PLL that inputs a reference signal such as $f_m$.

Tone detection by tone detection circuit 244 may be performed, for instance, at initial power-up of UE 110, during a calibration phase of UE 110, or at various times during operation of UE 110.

Figure 7:
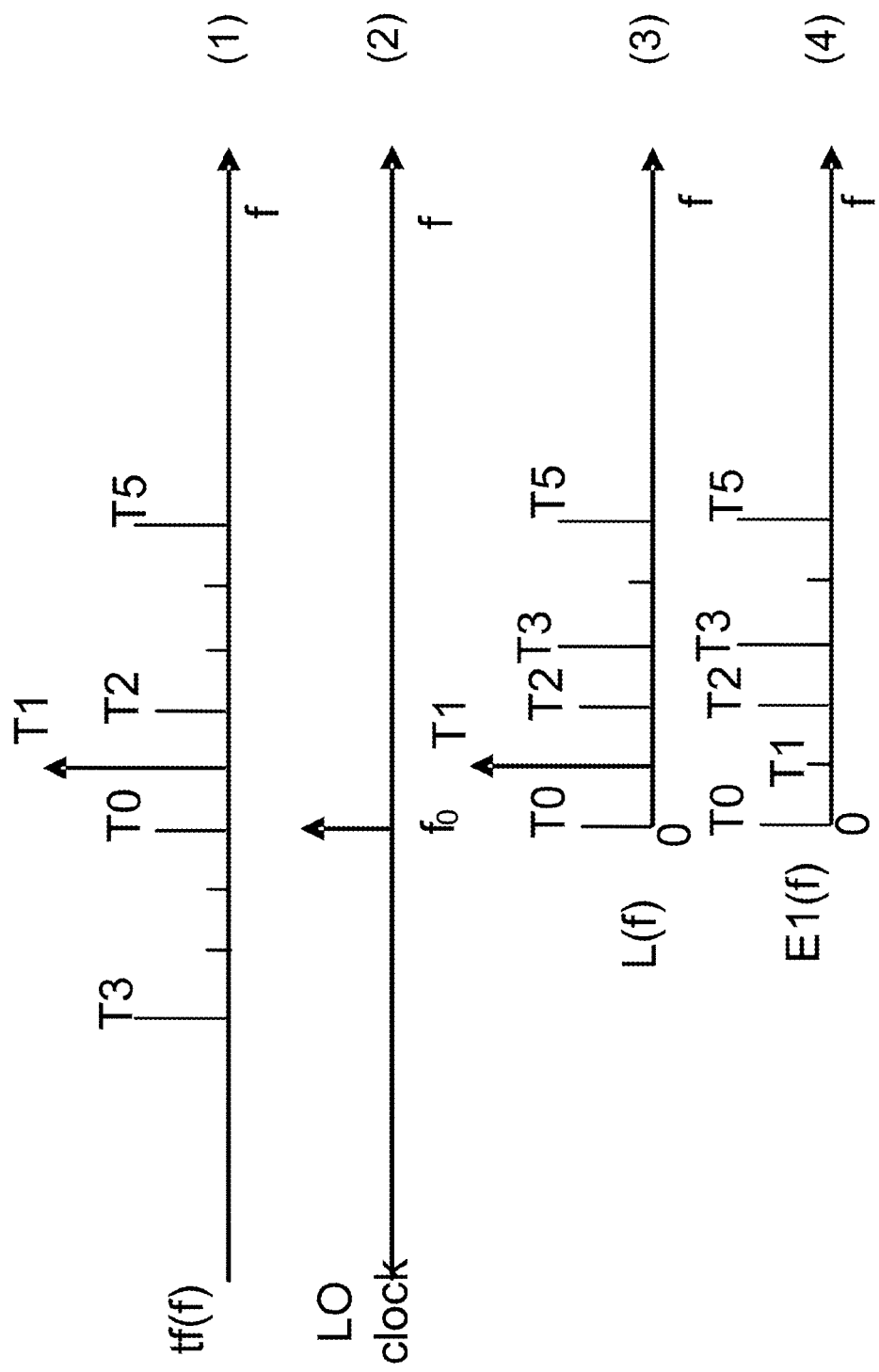
FIG. 7 is a diagram illustrating exemplary frequency spectrums of various signals in the tone detection circuit shown in FIGS. 6A and 6B.

FIG. 7 is a diagram illustrating exemplary frequency spectrums of various signals in tone detection circuit 244. In particular, from top to bottom, the following frequency spectrums are shown: (1) the frequency spectrum, tf(f), of the input signal, compensated version of the first-clipped clock signal, te(t), to tone detection circuit 244; (2) the frequency spectrum of the local oscillator clock; (3) the frequency spectrum, L(f), of signal L(t); and (4) the frequency spectrum, E1(*f*), of signal E1(*t*).

The frequency spectrum tf(f) of the input signal includes the desired tone, T1, and a number of unwanted tones (T0, T2, T3, and T5). Tones T0 and T2, for instance, may be created by local oscillator leakage or device mismatch. Tones T3 and T5, on the other hand, may be created by the odd orders of non-linearity of up-converter 220. Tone detection circuit 244 may be controlled by controller 246 to isolate, one at a time, tones T0 (n=0), T2 (n=2), T3 (n=3), and T5 (n=5). In this manner, residual error information corresponding to each of these unwanted tones may be generated and output to controller 246.

In frequency spectrum tf(f), it can be seen that the wanted tone, T1, has a relatively large amplitude compared to the unwanted tones. The large amplitude of T1 may drive the circuit into non-linear operation. In order to avoid this, a tone at the same amplitude but opposite in phase may be injected by coupler 610. The output frequency spectrum of coupler 610, tone E1(f), illustrates suppression of tone T1. After processing by LPF1 615, the signal can be further mixed by mixers 620 and 640 to down-convert the desired unwanted signal before low pass filtering to isolate the desired unwanted signal before it is amplified and digitally sampled.

In the exemplary implementation of tone detection circuit 244 in FIG. 6A, the quadrature local oscillator clock signals are used in first mixer 605 in an interleaved way and tone T1 is down-converted into the modulation frequency $f_m$. The large tone, T1, is then removed in order to keep the circuit in a linear region.

Figure 6B:
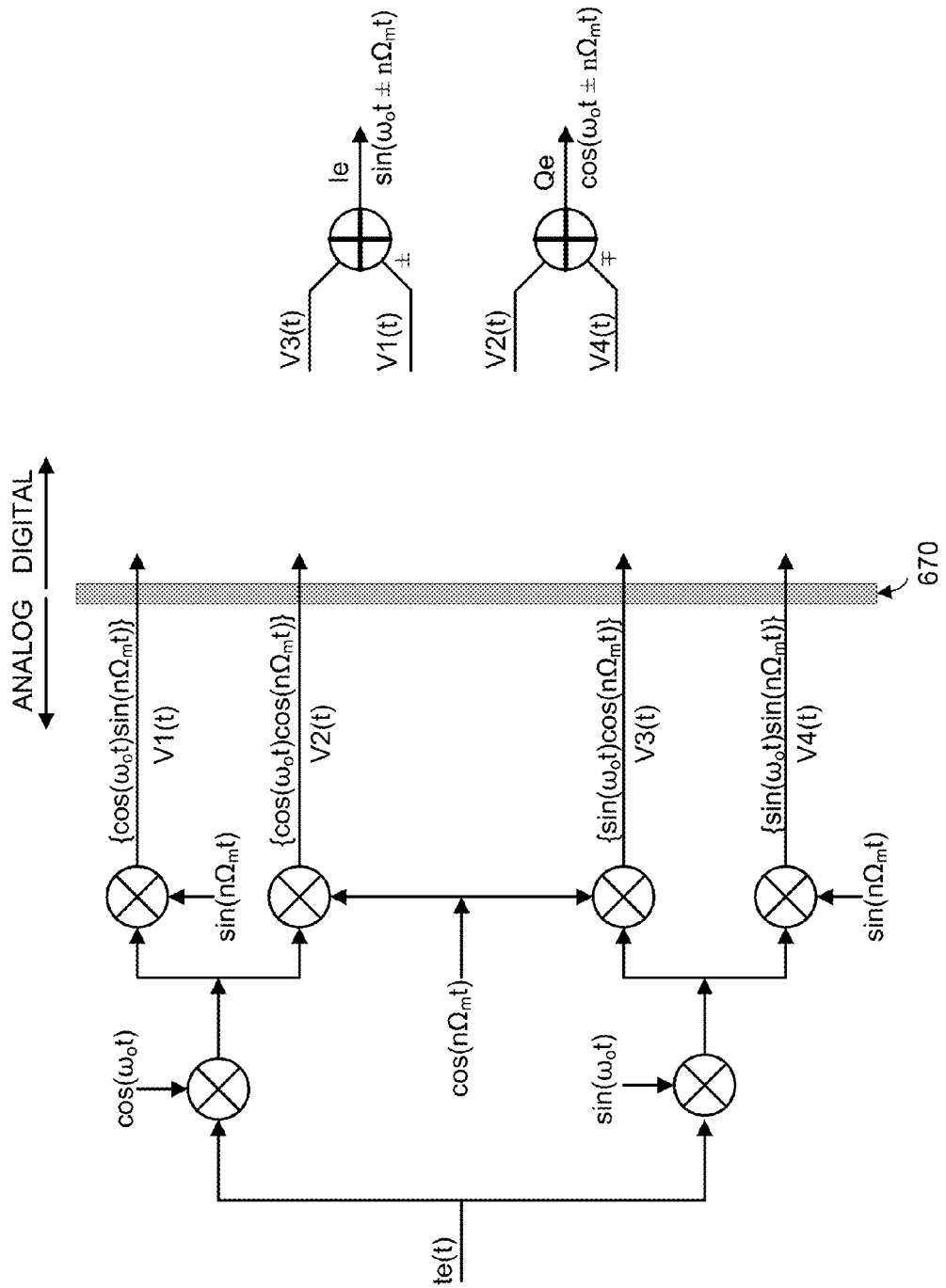
FIG. 6B is a diagram illustrating an equivalent, but simplified, circuit to the tone detection circuit shown in FIG. 6A.

FIG. 6A shows an interleaved tone detection topology. FIG. 6B is a diagram illustrating an equivalent circuit to FIG. 6A, where all filters and amplifiers as well as analog-to-digital converters are removed for simplicity. The left side of vertical lines 670 is implemented in the analog domain with tone detection circuits, and the right side of vertical lines 670 is implemented in the digital domain by controller 246. Clock signals are added to first and second stages of the mixers, which are modeled as multipliers that insert clock signals as path gains shown as the expression inside the brackets. With the path gains $\sin(\omega_o t \pm n\Omega_m t)$ and $\cos(\Omega_o t \pm n\Omega_m t)$, the arrangement can down-convert any tone at frequency $f_o \pm nf_m$ into quadrature outputs close to DC signals.

It can be appreciated that the topology shown in FIG. 6B can be implemented directly without using the interleaved topology shown in FIG. 6A. Also, the topology shown in FIG. 6A can be further interleaved by removing one of the signal paths to save hardware area.

In an alternative technique for implementing tone detection circuit 244, the generated clock signal may instead be self-mixed, and residual errors of the unwanted modulation tones are sequentially detected in amplitude (amplitude detected). As the signal is amplitude detected, the T1 tone may be down-converted to a DC signal. T1 may then be removed by high pass (or band pass) filtering. In this situation, the amplitude modulation tones can then be found either by directly feeding the signal to analog-to-digital converters with sufficient bandwidth, or by feeding the signal to a chain similar to the upper and lower signal paths (e.g., mixer 620, LPF2i 625, AMPi 630, and ADCi 635).

In another alternative technique for implementing tone detection circuit 244, instead of using a high speed analog-to-digital converter 635 or 655, high speed sample and hold circuits and low speed analog-to-digital converters may instead be used. The sample and hold circuits and low speed analog-to-digital converters are possible employed to replace the high speed analog-to digital converter because the residual errors of the unwanted modulation tones are periodic.

Figure 8:
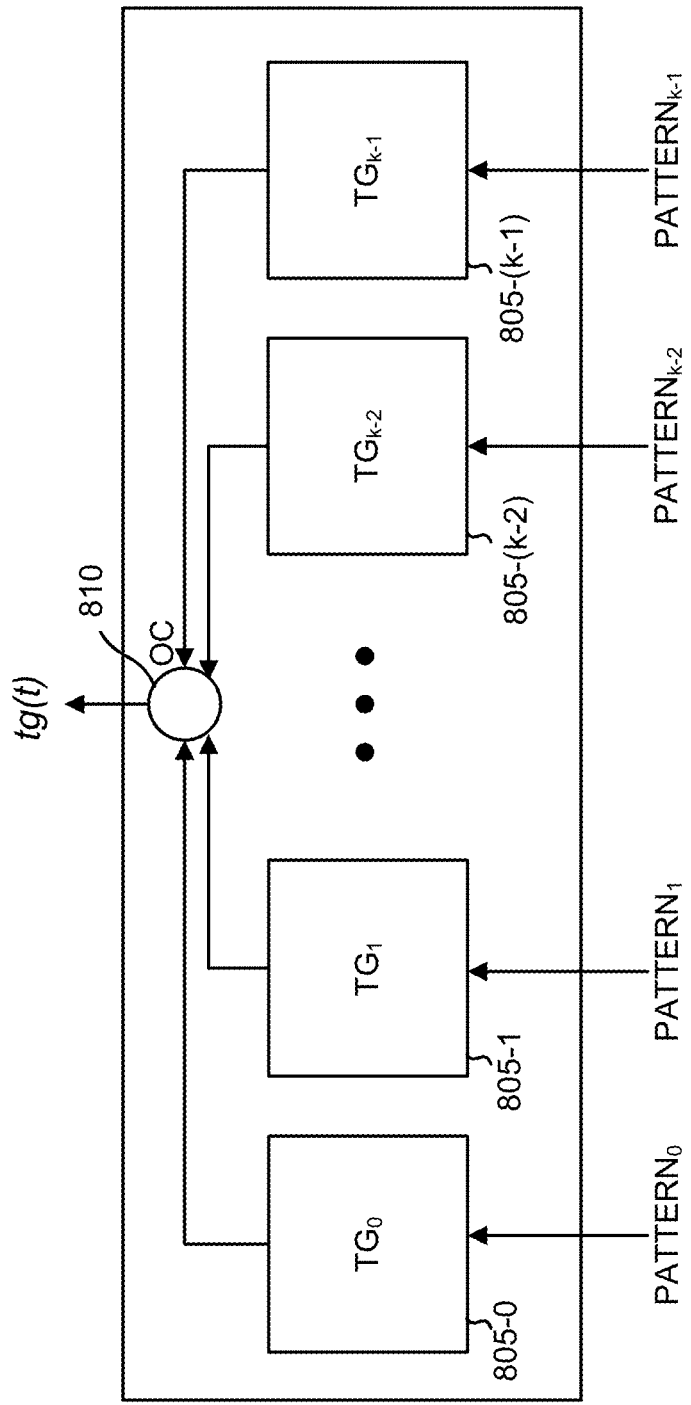
FIG. 8 is a diagram illustrating an exemplary implementation of a tone generator circuit.

FIG. 8 is a diagram illustrating an exemplary implementation of tone generation circuit 242. Tone generation circuit 242 may include a number (k) of individual tone generators (TGs) 805-0 through 805-(k-1) (collectively tone generators 805). There may be, for example, five TGs 805 (i.e., k equals 5). Each tone generator 805 may produce a tone at the same RF frequency and amplitude but opposite in phase, corresponding to an unwanted tone detected by tone detection circuit 244. Tone generation circuit 242 may additionally include output coupler (OC) 810. OC 810 may receive the tones generated by TGs 805 and may combine the tones to create output signal tg(t).

Each TG 805 may generate its output tone based on a pattern input, from controller 246, to each TG 805. The input patterns are illustrated in FIG. 8 as $PATTERN_0$ through $PATTERN_{k-1}$, which may be received from controller 246. Each pattern may include a vector that is stored in a memory or register corresponding to each TG 805.

OC 810 may include, for example, a passive coupling circuit, such as a resistor-capacitor (RC) based circuit, a tuned inductor-capacitor (LC) circuit, or other coupling circuits designed to combine the input tones into a single output signal. OC 810 may, in some implementations, convert the input signals from differential to single-ended output.

Although FIG. 8 shows exemplary components of tone generation circuit 242, in other embodiments, tone generation circuit 242 may contain fewer, different, differently arranged, or additional components than depicted in FIG. 8. Alternatively or additionally, one or more components of tone generation circuit 242 may perform one or more tasks described as being performed by one or more other components of tone generation circuit 242.

Figure 9:
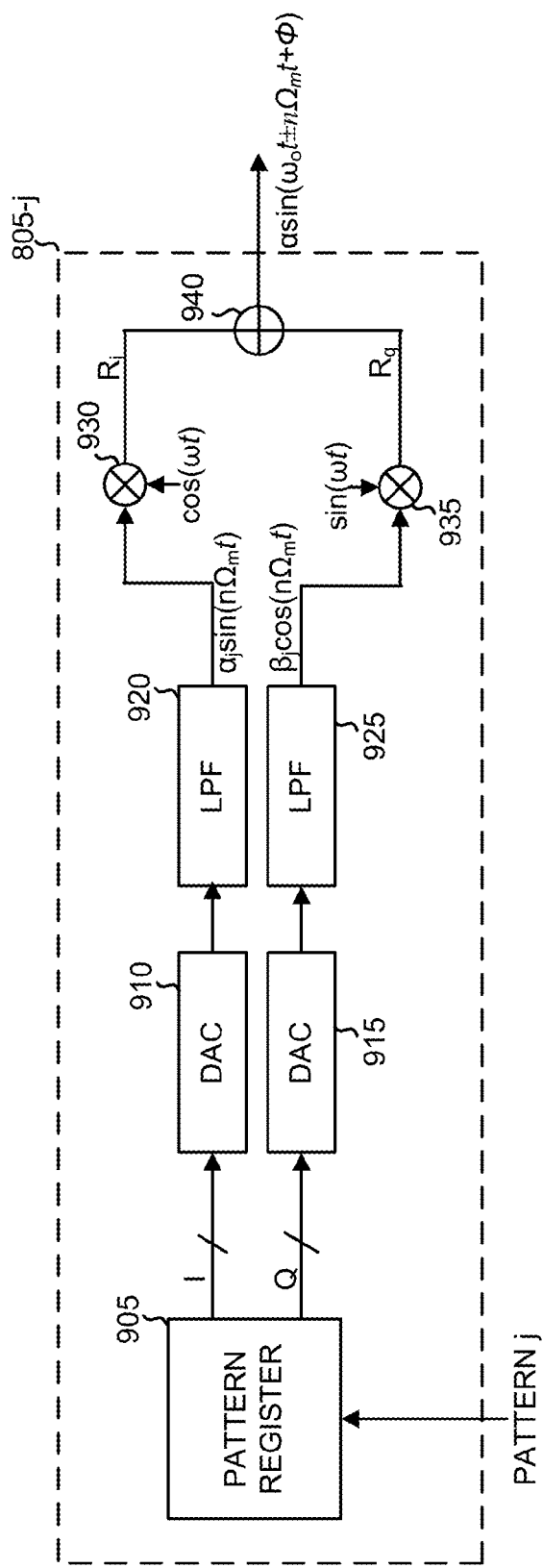
FIG. 9 is a diagram illustrating an exemplary implementation of the tone generator shown in FIG. 8.

FIG. 9 is a diagram illustrating an exemplary implementation of one of TGs 805, such as TG 805-j. TG 805-j may include pattern register 905, digital-to-analog converters (DACs) 910 and 915, low pass filters (LPFs) 920 and 925, mixers 930 and 935, and coupler 940. Internally, TG 805-j may generate a pair of quadrature signals, I and Q. The I signal may be output from pattern register 905 and processed by DAC 910 and LPF 920, creating harmonic baseband tone $\alpha_j \sin(n\Omega_m t)$, here $\alpha_j$ is an amplitude parameter. Mixer 930 up-converts the harmonic baseband tone $\alpha_j \sin(n\Omega_m t)$ into an RF output Ri using the quadrature local RF local clock signals. Similarly, the Q signal may be output from pattern register 905 and processed by DAC 915, LPF 925, creating $\beta_j \cos(n\Omega_m t)$. Mixer 935 up-converts the harmonic baseband tone $\beta_j \cos(n\Omega_m t)$ into the output Rq also using the quadrature local RF clock signals. The outputs Ri and Rq are merged into an up-converted tone by a coupler 940, which is implemented with a linearity load network. Just like normal QAM modulation, the parameters $\alpha_j$ and $\beta_j$, can change both amplitude and phase of the up-converted tone, so it has the same amplitude but opposite in phase responding to one of the unwanted tones under detection.

Pattern register 905 may include a random access memory (RAM) or other memory that can be programmed to include a series of digital values, that, when read out, as controlled by controller 246, represent a sinusoid tone. The particular sinusoid tone to output from pattern register 905 may be written to by controller 246, as illustrated by the input $PATTERN_1$.

DACs 910 and 920 may convert the patterns received from pattern register 905 to an analog signal. The analog signal produced by DACs 910 and 920 may be low pass filtered by LPFs 920 and 925, respectively.

Although FIG. 9 shows exemplary components of one of TGs 805, in other embodiments, TG 805 may contain fewer, different, differently arranged, or additional components than depicted in FIG. 9. For instance, the outputs of all pattern registers 905 can be summed together by an adder in digital format, thus the DACs 910 and 915, the LPFs 920 and 925, and the up-converter 930 and 935 can be shared inside the tone generation circuit 242. Alternatively or additionally, one or more components of TG 805 may perform one or more tasks described as being performed by one or more other components of TG 805.

Figure 10:
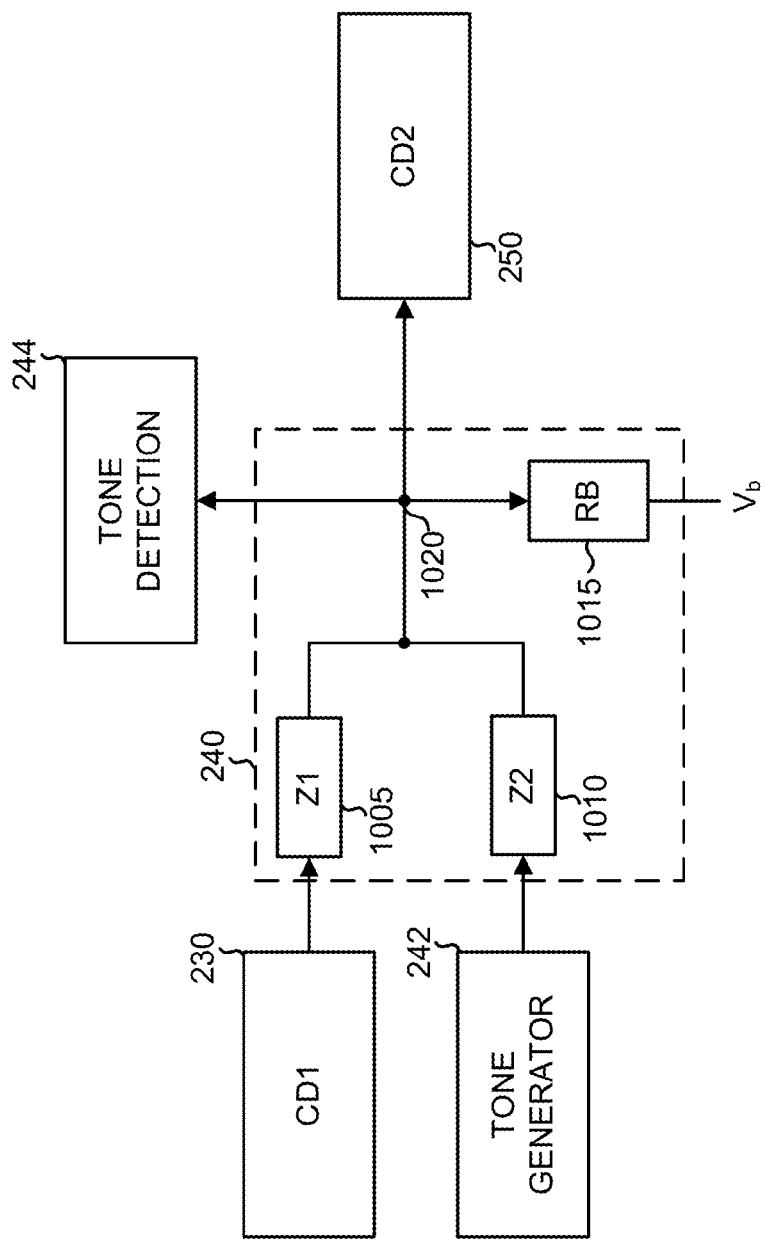
FIG. 10 is a diagram illustrating an exemplary implementation of a linear coupler.

FIG. 10 is a diagram illustrating an exemplary implementation of linear coupler 240, which may generally operate to couple the cancellation tone signal, tg(t), to the first clipped clock signal sf(t). Linear coupler 240 may be implemented using first impedance (Z1) 1005, second impedance (Z2) 1010, and resistance (RB) 1015. First impedance 1005 may connect to CD1 230 and output node 1020 of linear coupler 240, and second impedance 1010 may connect to tone generation circuit 242 and output node 1020, linearly creating the compensated version of the first-clipped clock signal, shown as te(t) in FIG. 2. Resistance 1015 may include a bias resistor connected to output node 1020 and a bias voltage ($V_b$). First impedance 1005 and second impedance 1010 may each include, for example, resistors, capacitors, inductive components, or combinations of these elements. First impedance 1005 and second impedance 1010 may be approximately equal to the output impedance of linear coupler 240.

Controller 246 may receive the residual error information from tone detection circuit 244 (i.e., $e_i(i)$ and $e_q(i)$) and, based on the residual error information, generate control signals for tone generation circuit 242. The control signals may include, for example, signals to write patterns to pattern registers 905 so that the output tones from tone generator 242 have an opposite phase and equal amplitude to the unwanted tones detected by tone detection circuit 244. Controller 246 may be implemented as, for example, a digital signal processor (DSP), application specific integrated circuit (ASIC), or other hardware or hardware/software based component.

Figure 11:
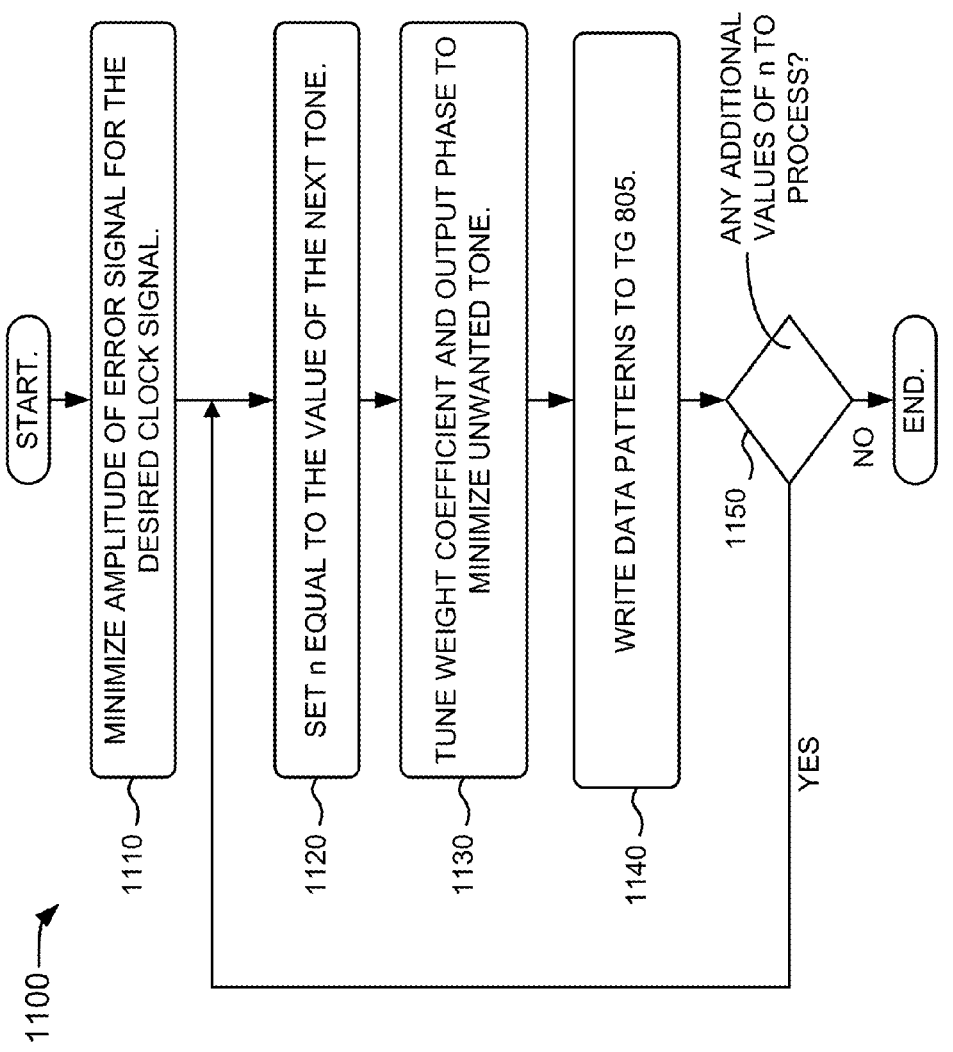
FIG. 11 is a flow chart illustrating an exemplary process for performing tone cancellation.

FIG. 11 is a flow chart illustrating an exemplary process 1100 for performing tone cancellation by controller 246.

Process 1100 may include minimizing the amplitudes of the unwanted modulation tones for the desired clock signal (block 1110). The desired clock signal corresponds to the tone at n=1. In tone detection circuit 244, as shown in FIG. 6A, for instance, controller 246 may set n=1 for the sinusoid signals input to mixers 620 and 640. Controller 246 may then adjust the weight coefficient ($A_1$) and the output phase ($\Phi_1$), which are used in the generated tone input to coupler 610 (FIG. 6A), so that the amplitude of the clock signal T1 is minimized to reduce the linearity requirement for tone detection circuit.

Process 1100 may also include setting n equal to the value of an unwanted tone that is to be cancelled (block 1120). As previously discussed, the tones that may need to be cancelled are the tones in the set n={3, 5, 0, 2}. For example, n may be set to three. Tone detection circuit 244 may then detect the tone at $f_c-3f_m$. Controller 246 may then tune the weight coefficients $\alpha_j$ and $\beta_j$, so that the amplitude of the error signal is minimized (block 1130). The data pattern for the signal having the determined amplitude and phase may be written to pattern register 905 for TG 805 (block 1140). More particularly, controller 246 may minimize $e(i)=\sqrt{e_i(i)^2+e_q(i)^2}$, here, i is an integer, and it is the time index for the $i^{th}$ sample.

The process shown in blocks 1120-1140 may be repeated for each tone that is to be cancelled, i.e., for each additional value of n (block 1150).

The cancellation results for process 1100 may depend on the sensitivity of tone detection circuit 244. Because the unwanted modulation tones are deterministic signals and the output signal from the tone detection circuit 244 can be a DC signal, the sensitivity of the tone detection circuit 244 can be set to be relatively high. To avoid flicker noise, chopping can be used in the amplifier and the analog-to-digital converters.

The techniques described above can be used in carrier aggregation, both in the receiver and transmitter. In carrier aggregation applications, several RF clock signals may be required for the Rx and/or the Tx chain in UE 110. Using a clock generator with tone cancellation may solve the issue of multiple RF clocks without degradation of the performance in the Rx (or Tx) chain.

The techniques described above can be used in a radio device to create both Rx clock signal and Tx clock signal, based on one on-chip PLL. The techniques described above can also be used in a radio device to create both Rx clock signals and Tx clock signals for different radio standards, like GSM, WCDMA, Bluetooth, WLNA, etc, based on one on-chip PLL and clock dividing method.

Systems and/or methods described herein may generate multiple RF clock signals without needing a corresponding PLL for each clock signal. Instead, multiple high quality clock signals are generated using a single PLL in which tone cancellation is applied to the generated clock signals to clean unwanted tones in the clock signals. In the tone cancellation, unwanted tones are detected and tones of opposite phase are added back to the RF signal. The tone cancellation can be used to cancel both unwanted modulation tones due to non-linearity of an up-converter and clock output leakage caused by device mismatch. Further, power consumption of tone detection circuit 244 may be relatively low, as tone detection circuit 244 may only need to be used occasionally, such as at a regular (small duty cycle) interval or at initial calibration.

The foregoing description of embodiments provides illustration and description, but is not intended to be exhaustive or to limit the invention to the precise form disclosed. Modifications and variations are possible in light of the above teachings or may be acquired from practice of the invention. For example, while a series of blocks has been described with regard to FIG. 11, the order of the blocks may be modified in other embodiments. Further, non-dependent blocks may be performed in parallel.

No element, block, or instruction used in the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A clock generator circuit for generating a wanted RF clock signal, the clock generator circuit comprising:
    an up-converter to up-convert modulation signals and quadrature local radio frequency clock signals to obtain an up-converted signal having a frequency equal to a desired frequency of the wanted RF clock signal;
    a band pass filter to filter the up-converted signal to output a filtered version of the up-converted signal;
    a first clock driver/divider to amplify and clip the filtered version of the up-converted signal into a first-clipped clock signal;
    a spurious tone cancellation circuit to receive the first-clipped clock signal, the spurious tone cancellation circuit including:
        a tone detection circuit to detect a residual error signal of one or more unwanted tones in a compensated version of the first-clipped clock signal, a tone generation circuit to generate cancellation tones based on the detected one or more unwanted tones, and a coupler to couple the cancellation tones to the first-clipped clock signal to obtain the compensated version of the first-clipped clock signal; and a second clock driver/divider to further clip the compensated version of the first-clipped clock signal to obtain the wanted RF clock signal.

2. The clock generator circuit of claim 1, where the tone generation circuit includes:

a plurality of tone generators;

an output coupler to combine cancellation tones from the plurality of tone generators, each of the tone generators comprising:

a pair of pattern registers storing patterns corresponding to one of the cancellation tones;

a pair of digital-to-analog converters to convert digital patterns to quadrature analog outputs;

a pair of low pass filters to reconstruct the quadrature analog outputs; and a quadrature up-converter to up-convert the reconstructed quadrature analog outputs into RF clock frequency.

3. The clock generator circuit of claim 1, where the tone generation circuit includes:

a plurality of pattern registers;

a digital adder to sum the outputs of the pattern registers;

a pair of digital-to-analog converters to convert digital patterns from the digital adder to quadrature analog outputs;

a pair of low pass filters to reconstruct the quadrature analog outputs; and a quadrature up-converter to up-convert the reconstructed quadrature analog outputs into RF clock frequency.

4. The clock generator circuit of claim 1, where the tone detection circuit includes:

a first mixer to receive the compensated version of the first-clipped clock signal as an input signal and down-convert the input signal based on the quadrature local radio frequency clock signal; and a second mixer to convert the down-converted signal to a signal that includes a baseband representation of one of the one or more unwanted tones.

5. The clock generator circuit of claim 1, where the spurious tone cancellation circuit additionally includes:

a controller to set one of the one or more unwanted tones that is to be detected by the tone detection circuit, and to write or modify digital patterns to the tone generation circuit, in which the digital patterns are up-converted to the cancellation tones.

6. The clock generation circuit of claim 5, where the controller calculates the digital patterns based on detected amplitude and phase values corresponding to the residual error signal of the unwanted tones, and writes or modifies the digital patterns to implement a procedure of minimizing the residual error signals.

7. The clock generation circuit of claim 6, where the controller controls the tone detection circuit to detect the amplitudes and phases during initial calibration or test mode operation of the clock generation circuit.

8. The clock generation circuit of claim 6, where the controller controls the tone detection circuit to sequentially detect the residual error signals of each of the one or more unwanted tones.

9. The clock generation circuit of claim 1, where the clock generation circuit is implemented within a wireless communication terminal.

10. The clock generation circuit of claim 1, where the wanted RF clock signal is generated in devices using wireless standards including GSM, WCDMA, Bluetooth, WLAN, or LTE.

11. A method of producing a wanted RF clock signal, the method comprising:

mixing modulation signals and quadrature local radio frequency clock signals to obtain an up-converted signal having a frequency tone equal to a desired frequency of the wanted RF clock signal;

band-pass filtering the up-converted signal to output a filtered version of the up-converted signal;

clipping, by a first clock driver/divider, the filtered version of the up-converted signal to a first clipped clock signal;

sequentially detecting residual error signals of a plurality of unwanted frequency tones in a compensated version of the first-clipped clock signal;

writing data patterns based on the detected plurality of unwanted frequency tones, to one or more memories, where the data patterns, when read out from the one or more memories, produce cancellation tones that have amplitude and phase values to cancel the plurality of unwanted frequency tones;

tuning the amplitude and phase corresponding to the data patterns based on the detected residual error signals;

coupling the cancellation tones to the first-clipped clock signal to obtain the compensated version of the first-clipped clock signal; and clipping, by a second clock driver/divider, the compensated version of the first-clipped clock signal to obtain the wanted RF clock signal.

12. The method of claim 11, where multiple RF clock signals are generated using one phase locked loop.

13. A mobile terminal comprising:

an antenna;

a processing system to control the operation of the mobile terminal; and a transceiver component, connected to the processing system and the antenna, to wirelessly send and receive data, the transceiver component including a clock generator circuit for generating a wanted RF clock signal, the clock generator circuit including an up-converter to up-convert modulation signals and quadrature local radio frequency clock signals to obtain an up-converted signal having a frequency tone equal to a desired frequency of the wanted RF clock signal;

a first clock driver/divider to amplify and clip the up-converted signal into a first-clipped clock signal;

a tone detection circuit to detect a residual error signal of one or more unwanted tones in a compensated version of the first-clipped clock signal;

a controller to determine cancellation tones corresponding to the detected one or more unwanted tones;

a tone generation circuit to generate the cancellation tones determined by the controller;

a coupler to couple the cancellation tones to the first-clipped clock signal to obtain the compensated version of the first-clipped clock signal; and a second clock driver/divider to further amplify, clip and convert the compensated version of the first-clipped clock signal to the wanted RF clock signal.

14. The mobile terminal of claim 13, where the tone generation circuit further includes:

a memory, where the tone generation circuit generates the cancellation tones based on digital patterns read from the memory.

15. The mobile terminal of claim 13, further comprising:
a band pass filter to filter the up-converted signal and to output a filtered version of the up-converted signal to the first clock driver/divider.

16. The mobile terminal of claim 15, wherein the clock generator circuit generates RF clock signals for both transmitter and receiver of the transceiver using one single PLL.

* * * * *

UNITED STATES PATENT AND TRADEMARK OFFICE
CERTIFICATE OF CORRECTION

PATENT NO. : 8,489,040 B2
APPLICATION NO. : 12/708349
DATED : July 16, 2013
INVENTOR(S) : Mu Page 1 of 1

It is certified that error appears in the above-identified patent and that said Letters Patent is hereby corrected as shown below:

In the Specification

In Column 1, Line 44, delete "$f_o+f_m$," and insert -- $f_o+f_m$ --, therefor.

In Column 5, Line 21, delete "$f_m$ and" and insert -- $f_m$, and --, therefor.

In Column 5, Line 25, delete "$f_n$ may" and insert -- $f_m$ may --, therefor.

In Column 6, Line 9, delete "$O_{qn}$, to" and insert -- $O_{qn}$ to --, therefor.

In Column 6, Line 12, delete "$O_{qn}$ and" and insert -- $O_{qn}$, and --, therefor.

In Column 9, Line 37, delete "$\cos(\Omega_o t \pm n\Omega_m t)$," and insert -- $\cos(\omega_o t \pm n\Omega_m t)$, --, therefor.

Signed and Sealed this
Third Day of December, 2013

Margaret A. Focarino
*Commissioner for Patents of the United States Patent and Trademark Office*